US012782416B2

(12) United States Patent
Hu

(10) Patent No.: US 12,782,416 B2

(45) Date of Patent: Nov. 3, 2026

(54) TRANSIENT VOLTAGE SUPPRESSOR FAILURE MONITORING CIRCUIT

(71) Applicant: Suzhou MetaBrain Intelligent Technology Co., Ltd., Suzhou (CN)

(72) Inventor: Zhaodi Hu, Suzhou (CN)

(73) Assignee: Suzhou MetaBrain Intelligent Technology Co., Ltd., Suzhou (CN)

( * ) Notice: Subject to any disclaimer, the term of this patent is extended or adjusted under 35 U.S.C. 154(b) by 127 days.

(21) Appl. No.: 18/876,809

(22) PCT Filed: Jun. 27, 2023

(86) PCT No.: PCT/CN2023/102840

§ 371 (c)(1),
(2) Date: Dec. 19, 2024

(87) PCT Pub. No.: WO2024/109025

PCT Pub. Date: May 30, 2024

(65) Prior Publication Data

US 2026/0243817 A1 Aug. 20, 2026

(30) Foreign Application Priority Data

Nov. 24, 2022 (CN) ........................ 202211482546.6

(51) Int. Cl.
*G01R 31/02* (2006.01)
*G01R 31/26* (2020.01)
*G01R 31/27* (2006.01)

(52) U.S. Cl.
CPC ......... *G01R 31/2632* (2013.01); *G01R 31/27* (2013.01)

(58) Field of Classification Search
CPC ............................ G01R 31/2632; G01R 31/27
See application file for complete search history.

(56) References Cited

U.S. PATENT DOCUMENTS 5,914,662 A 6/1999 Burleigh
9,383,405 B2 * 7/2016 Hess ...................... H02H 9/041
(Continued)

FOREIGN PATENT DOCUMENTS

CN 202678082 U 1/2013
CN 105556322 A 5/2016
(Continued)

OTHER PUBLICATIONS

International Search Report cited in PCT/CN2023/102840, mailed Oct. 18, 2023, 7 pages.
(Continued)

*Primary Examiner* — Thang X Le
(74) *Attorney, Agent, or Firm* — COOPER LEGAL GROUP LLC

(57) ABSTRACT

The present application discloses a transient voltage suppressor (TVS) failure monitoring circuit, and relates to the technical field of circuit protection. A differential amplification module and a voltage sampling module of a circuit are electrically connected to a TVS. When the TVS is switched from a high impedance state to a low impedance state, an operational amplifier in the differential amplification module obtains a TVS active signal. A statistical module is electrically connected to the differential amplification module. The statistical module counts operation count signals, and outputs an aging signal of the TVS.

20 Claims, 7 Drawing Sheets

(56) References Cited

U.S. PATENT DOCUMENTS

| | | | | |
|---|---|---|---|---|
| 11,949,228 | B1 * | 4/2024 | Bradley | H02H 3/162 |
| 2016/0097803 | A1 * | 4/2016 | Quigley | G01R 31/2827 324/750.3 |
| 2017/0155244 | A1 * | 6/2017 | Dickey | H03K 17/74 |
| 2019/0178930 | A1 | 6/2019 | Dickey | |
| 2019/0353694 | A1 | 11/2019 | Kim et al. | |

FOREIGN PATENT DOCUMENTS

| | | | |
|---|---|---|---|
| CN | 109473424 | A | 3/2019 |
| CN | 211505722 | U | 9/2020 |
| CN | 217335075 | U | 8/2022 |
| CN | 115588973 | A | 1/2023 |
| WO | 2022127633 | A1 | 6/2022 |

OTHER PUBLICATIONS

Written Opinion cited in PCT/CN2023/102840, mailed Oct. 18, 2023, 8 pages.
First Office Action cited in CN202211482546.6, mailed Jan. 16, 203, 8 pages.
Notification to Grant Patent Right for Invention cited in CN202211482546.6, mailed Feb. 25, 2023, 4 pages.

* cited by examiner

TRANSIENT VOLTAGE SUPPRESSOR FAILURE MONITORING CIRCUIT

CROSS-REFERENCE TO RELATED APPLICATION

This application claims priority to Chinese Patent Application No. 202211482546.6, filed on Nov. 24, 2022 in China National Intellectual Property Administration, and entitled "TRANSIENT VOLTAGE SUPPRESSOR FAILURE MONITORING CIRCUIT", which is hereby incorporated by reference in its entirety.

FIELD

The present application relates to the technical field of circuit protections, and in particular, to a transient voltage suppressor (TVS) failure monitoring circuit.

BACKGROUND

With rapid development of server performance, safety and stability of servers during long-term high load operations have received widespread market attention. Power supply units (PSUs) are direct power supplies for supplying power to most servers. For safety reasons, a voltage output end of a PSU needs to provide a P12V/P54V voltage to a board through an electronic fuse (E-Fuse) to protect the board and support a hot swap function of the board. Generally, no matter an integrated E-Fuse or a separate E-Fuse is used, a transient voltage suppressor (TVS) is placed at an input pin of the E-Fuse to protect an input end of the E-Fuse in the following special cases such as: (1) in a case that a post-stage circuit at an output end of the E-Fuse is instantly short circuited and a relatively large peak voltage is generated at the input end of the E-Fuse; (2) in a case that a front end of the E-Fuse encounters an energy shock caused by a lightning surge; and (3) in a case that voltage overshoot is caused by hot swapping. There is a risk of component burnout due to a sudden increase in an input voltage in the above cases. The TVS can reduce impedance in a short time ($10^{-12}$ seconds), instantly release energy, and clamp a voltage at two ends of a device at a preset value to protect the post-stage circuit. FIG. 1 is a conventional application method for an E-Fuse. In an upper left box in FIG. 1, a TVS Z1 and a capacitor filter are connected in parallel between a voltage input end $V_{IN}$ and the ground.

However, the inventor realizes that the TVS will be burnt out due to electrical over stress when transient energy far exceeds several times that the TVS can withstand; alternatively, the TVS causes aging failure after being subjected to thousands of standard pulse shocks. In both cases above, the failure of the TVS exhibits short-circuit characteristics. After the TVS fails and is short circuited, any protection cannot be provided for a circuit, and a risk of board burnout is easily caused. Therefore, there is an urgent need for a TVS failure monitoring circuit. When the TVS is in operation, a number of times that the TVS releases energy is counted, and an aging alarm is given timely before TVS failure; and meanwhile, the circuit can be cut off timely to protect the board at the instant of the TVS failure.

SUMMARY

In a first aspect, a transient voltage suppressor (TVS) failure monitoring circuit is provided. A cathode of a TVS is electrically connected to one end of a fuse FUSE. An anode of the TVS is grounded. The other end of the fuse is electrically connected to a voltage input end. The circuit includes:

a differential amplification module, a voltage sampling module, and a statistical module.

The differential amplification module includes: a differential amplification module first port, a differential amplification module second port, a differential amplification module third port, a differential amplification module fourth port, a differential amplification module fifth port, a differential amplification module sixth port, and a differential amplification module seventh port. The differential amplification module first port is configured to obtain an input voltage. The differential amplification module second port is configured to obtain a cathode voltage drop of the TVS. The differential amplification module third port is configured to obtain a sampling voltage of the voltage sampling module. The differential amplification module fourth port is configured to transmit a TVS active signal. The differential amplification module fifth port and the differential amplification module sixth port are configured to obtain a power voltage. The differential amplification module seventh port is grounded. The TVS active signal is used for indicating that the TVS is switched from a high impedance state to a low impedance state and then returns to the high impedance state.

The voltage sampling module includes: a voltage sampling module first port, a voltage sampling module second port, and a voltage sampling module third port. The voltage sampling module first port is configured to obtain the cathode voltage drop of the TVS. The voltage sampling module third port is configured to sample the cathode voltage drop of the TVS.

The statistical module includes: a statistical module first port, a statistical module second port, a statistical module third port, a statistical module fourth port, and a statistical module fifth module. The statistical module first port is configured to obtain the TVS active signal. The statistical module second port is grounded. The statistical module third port is configured to obtain the power voltage. The statistical module fourth port is configured to output an operation count signal of the TVS. The statistical module fifth port is configured to output an aging signal of the TVS.

The voltage sampling module first port is electrically connected to the cathode of the TVS. The voltage sampling module second port is electrically connected to the anode of the TVS. The voltage sampling module third port is electrically connected to the differential amplification module third port. The differential amplification module first port is electrically connected to the voltage input end. The differential amplification module second port is electrically connected to the cathode of the TVS. The differential amplification module fifth port is electrically connected to a first power supply. The differential amplification module sixth port is electrically connected to a second power supply. The differential amplification module fourth port is electrically connected to the statistical module first port. The statistical module third port is electrically connected to a third power supply.

In a second aspect, a power system is provided. The power system includes: a power supply and the TVS failure monitoring circuit recorded in the foregoing first aspect.

The power supply includes a power voltage output end. The power voltage output end is electrically connected to a voltage input end of the monitoring circuit.

In a third aspect, a TVS failure monitoring system is provided. The monitoring system includes an E-Fuse and the power system recorded in the foregoing second aspect.

The E-Fuse includes a first insurance port and a second insurance port.

The first insurance port is electrically connected to a voltage input end of the power system. The second insurance port is configured to provide an output voltage according to a voltage received by the voltage input end.

In a fourth aspect, a TVS failure monitoring method is provided, which is applied to the TVS failure monitoring circuit recorded in the foregoing first aspect. The method includes:

obtaining an operation count signal and an aging signal, where the operation count signal is used for indicating an operation count of the TVS, and the aging signal is used for indicating an aging state of the TVS; and displaying the operation count and the aging state on a user interface (UI) of a user terminal according to the operation count signal and the aging signal.

In a fifth aspect, a TVS failure monitoring apparatus is provided. The apparatus includes: a signal obtaining module and a display module.

The signal obtaining module is configured to obtain an operation count signal and an aging signal, where the operation count signal is used for indicating an operation count of the TVS, and the aging signal is used for indicating an aging state of the TVS.

The display module is configured to display the operation count and the aging state on a UI of a user terminal according to the operation count signal and the aging signal.

In a sixth aspect, a computer device is provided, including a memory and one or more processors. The memory stores computer-readable instructions. The foregoing computer-readable instructions, when executed by the one or more processors, enable the foregoing one or more processors to perform the operations of the TVS failure monitoring method recorded in the foregoing fourth aspect.

In a seventh aspect, one or more non-volatile computer-readable storage media storing computer-readable instructions are provided. The computer-readable instructions, when executed by one or more processors, enable the one or more processors to perform the operations of the TVS failure monitoring method recorded in the foregoing fourth aspect.

Details of one or more embodiments of the present application are provided in the following drawings and descriptions. Other features and advantages of the present application will become apparent from the specification, the drawings, and the claims.

BRIEF DESCRIPTION OF THE DRAWINGS

To describe technical solutions in embodiments of the present application more clearly, drawings required to be used in descriptions about the embodiments will be simply introduced below. Apparently, the drawings in the following descriptions are only some embodiments of the present application. Those ordinarily skilled in the art also can obtain other drawings according to the provided drawings without creative work.

DETAILED DESCRIPTION

Figure 1:
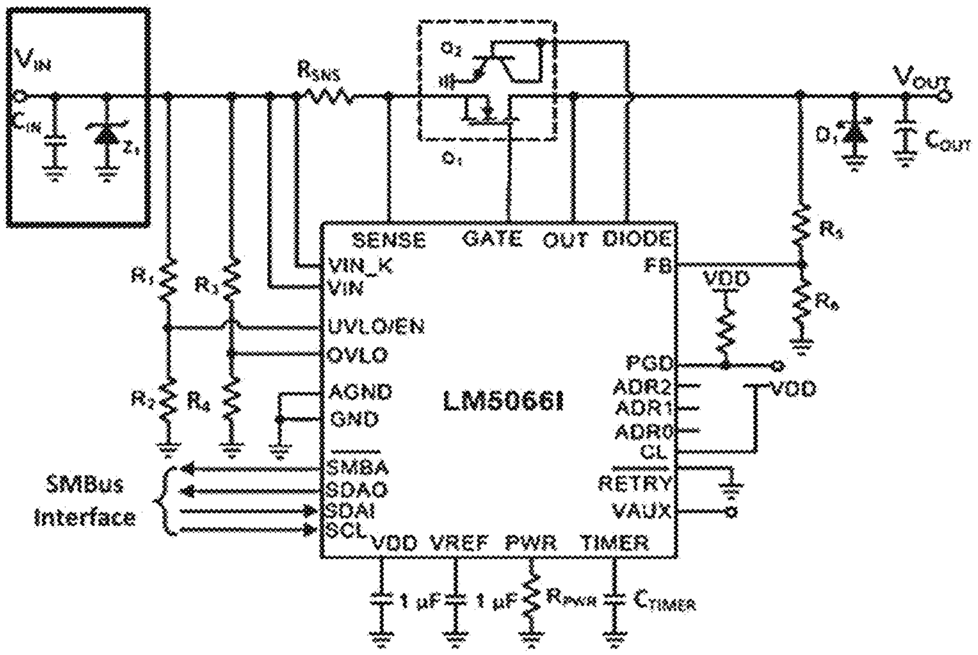
FIG. 1 is a schematic diagram of a conventional application method of a TVS.

To make objectives, technical solutions, and advantages of the present application clearer, the technical solutions in the implementations of the present application are described clearly and completely with reference to drawings in the implementations of the present application. Apparently, the described implementations are only part rather than all of the embodiments of the present application. All other embodiments obtained by those of ordinary skill in the art based on the embodiments of the present application without creative efforts fall within the scope of protection of the present application.

Unless otherwise defined, technical terms or scientific terms used in the present disclosure have common meanings understood by those of ordinary in the art to which the present disclosure belongs. "First", "second", and similar words used in the present disclosure are only used to distinguish different components without indicating any sequence, quantity, or importance. Similarly, similar words such as "one", "a", and "the" do not represent a limitation to a quantity, but represents existence of at least one. Numbers in the drawings in the specification only represent the distinction between various functional components or modules, but do not represent a logical relationship between components or modules. Similar words such as "include" and "comprise" are intended to indicate that elements or objects preceding the words cover elements or objects and their equivalents listed after the words, without excluding other elements or objects. Similar words such as "connect" and "interconnect" are not limited to physical or mechanical connection but may include electrical connection, either direct or indirect. "Above", "below", "left", "right", and the like are only used to indicate relative position relationships. When the absolute position of a described object changes, the relative position relationship may also change accordingly.

Various embodiments according to the present disclosure will be described below in detail with reference to drawings. It is to be noted that the same reference signs in the drawings are endowed with components having basically the same or similar structures and functions, and repeated descriptions thereof will be omitted.

In the prior art, there is a potential risk of server board burnout since a post-stage circuit cannot be effectively protected due to sudden failure of a transient voltage suppressor (TVS) caused by aging. Embodiments of the present application provide a TVS failure monitoring circuit. When the TVS is in operation, a number of times that a TVS releases energy can be counted, and an aging alarm can be given timely before TVS failure, which facilitates maintaining circuit components by an engineer to ensure normal operation of a server system.

Figure 2:
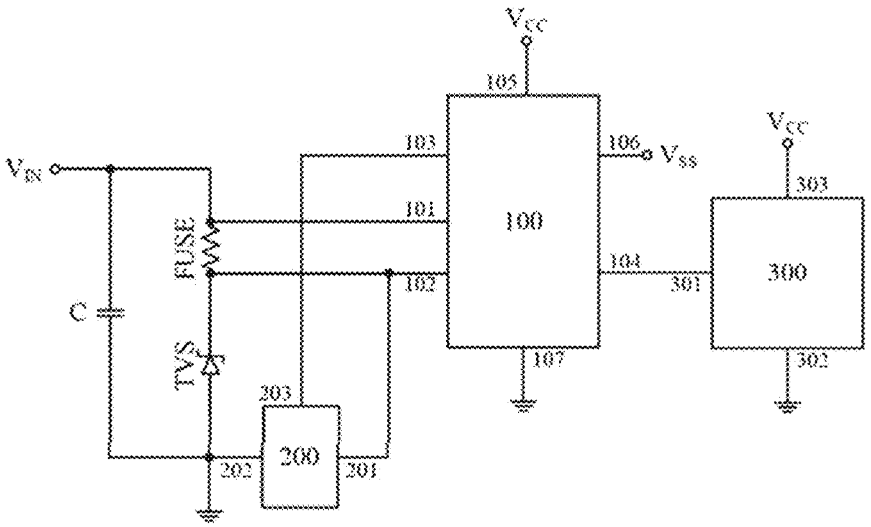
FIG. 2 is a schematic diagram of modules of a TVS failure monitoring circuit according to one or more embodiments of the present application.

As shown in FIG. 2, a TVS failure monitoring circuit is provided. A cathode of a TVS is electrically connected to one end of a fuse FUSE. An anode of the TVS is grounded. The other end of the fuse FUSE is electrically connected to a voltage input end $V_{IN}$ to prevent a back-end circuit from burnout after the TVS fails and is short circuited. The TVS can change from high impedance to low impedance in a short time (generally, 10-12 seconds) when an input end encounters a voltage overshoot, so that excess energy is released to protect a post-stage circuit. The fuse FUSE has a nominal resistance value $R_{DC}$. At the instant when the TVS is turned on, a current flows through the fuse FUSE. Under the action of the current, a voltage drop is generated between two ends of the fuse FUSE.

In one or more implementations, a capacitor is further connected in parallel between the voltage input end $V_{IN}$ and the ground to further stabilize an input voltage.

The TVS failure monitoring circuit includes:

a differential amplification module 100, a voltage sampling module 200, and a statistical module 300.

The differential amplification module 100 includes: a differential amplification module first port 101, a differential amplification module second port 102, a differential amplification module third port 103, a differential amplification module fourth port 104, a differential amplification module fifth port 105, a differential amplification module sixth port 106, and a differential amplification module seventh port 107. The differential amplification module first port 101 is configured to obtain an input voltage. The differential amplification module second port 102 is configured to obtain a cathode voltage drop of the TVS. The differential amplification module third port 103 is configured to obtain a sampling voltage of the voltage sampling module. The differential amplification module fourth port 104 is configured to transmit a TVS active signal. The differential amplification module fifth port 105 and the differential amplification module sixth port 106 are configured to obtain a power voltage. The differential amplification module seventh port 107 is grounded. The TVS active signal is used for indicating that the TVS is switched from a high impedance state to a low impedance state and then returns to the high impedance state, that is, the TVS enters a working state once.

The voltage sampling module 200 includes: a voltage sampling module first port 201, a voltage sampling module second port 202, and a voltage sampling module third port 203. The voltage sampling module first port 201 is configured to obtain the cathode voltage drop of the TVS. The voltage sampling module third port 203 is configured to sample the cathode voltage drop of the TVS.

The statistical module 300 includes: a statistical module first port 301, a statistical module second port 302, a statistical module third port 303, a statistical module fourth port 304, and a statistical module fifth module 305. The statistical module first port 301 is configured to obtain the TVS active signal. The statistical module second port 302 is grounded. The statistical module third port 303 is configured to obtain the power voltage. The statistical module fourth port 304 is configured to output an operation count signal of the TVS. The statistical module fifth port 305 is configured to output an aging signal of the TVS.

The voltage sampling module first port 201 is electrically connected to the cathode of the TVS. The voltage sampling module second port 202 is electrically connected to the anode of the TVS. The voltage sampling module third port 203 is electrically connected to the differential amplification module third port 103. The differential amplification module first port 101 is electrically connected to the voltage input end $V_{IN}$. The differential amplification module second port 102 is electrically connected to the cathode of the TVS. The differential amplification module fifth port 105 is electrically connected to a first power supply $V_{CC1}$. The differential amplification module sixth port 106 is electrically connected to a second power supply $V_{SS}$. The differential amplification module seventh port 107 is grounded. The differential amplification module fourth port 104 is electrically connected to the statistical module first port 301. The statistical module second port 302 is grounded. The statistical module third port 303 is electrically connected to a third power supply $V_{CC2}$. The statistical module fourth port 304 is configured to output the operation count signal of the TVS. The statistical module fifth port 305 is configured to output the aging signal of the TVS.

The voltage sampling module 200 generates a first signal according to a cathode voltage of the TVS, and transmits the first signal to the differential amplification module first port 101 through the voltage sampling module third port 203. The differential amplification module 100 generates the TVS active signal according to a voltage at the voltage input end $V_{IN}$, the cathode voltage of the TVS, and the first signal, and transmits the TVS active signal to the statistical module first port 301 through the differential amplification module fourth port 104. The statistical module 300 generates the operation count signal and the aging signal according to the TVS active signal.

Figure 3:
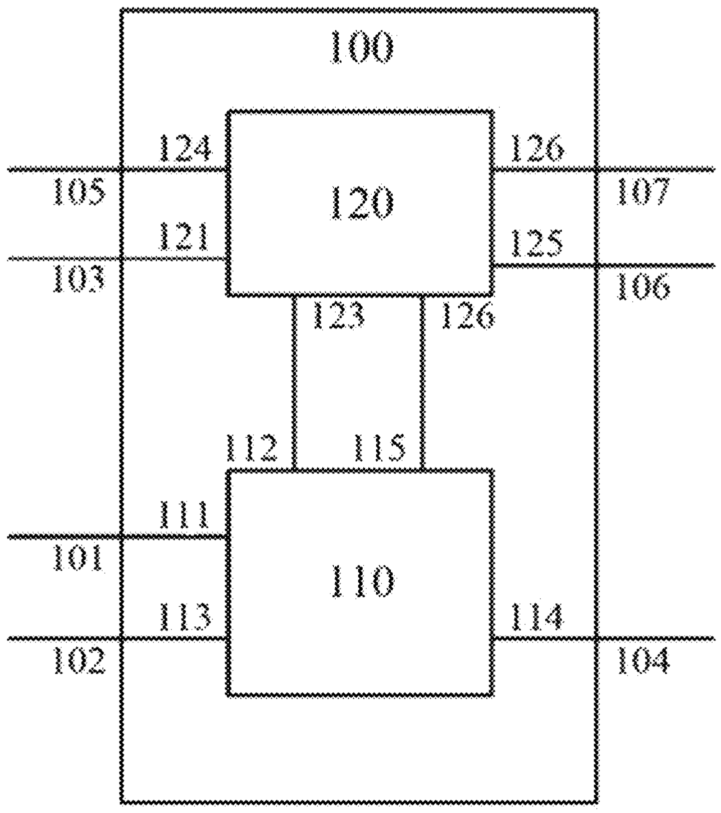
FIG. 3 is a schematic diagram of a differential amplification module according to one or more embodiments of the present application.

Specifically, as shown in FIG. 3, the differential amplification module 100 includes: a signal amplification module 110 and a differential level module 120.

The signal amplification module 110 includes a signal amplification module first port 111, a signal amplification module second port 112, a signal amplification module third port 113, a signal amplification module fourth port 114, and a signal amplification module fifth port 115. The signal amplification module first port 111 serves as the differential amplification module first port 101 and is configured to obtain the input voltage. The signal amplification module second port 112 is grounded. The signal amplification module third port 113 serves as the differential amplification module second port 102 and is configured to obtain the cathode voltage drop of the TVS. The signal amplification module fourth port 114 serves as the differential amplification module fourth port 104 and is configured to transmit the TVS active signal. The signal amplification module fifth port 115 is configured to obtain the power voltage.

The differential level module 120 includes: a differential level module first port 121, a differential level module second port 122, a differential level module third port 123, a differential level module fourth port 124, a differential level module fifth port 125, and a differential level module sixth port 126. The differential level module first port 121 serves as the differential amplification module third port 103 and is configured to obtain the sampling voltage of the voltage sampling module. The differential level module second port 122 serves as the differential amplification module seventh port 107 and is grounded. The differential level module third port 123 is grounded. The differential level module fourth port 124 serves as the differential amplification module fifth port 105. The differential level module fifth port 125 serves as the differential amplification module sixth port 106 and is configured to obtain the power voltage. The differential level module sixth port 126 is configured to supply the power voltage to the signal amplification module.

The signal amplification module second port 112 is electrically connected to the differential level module third port 123. The signal amplification module fifth port 115 is electrically connected to the differential level module sixth third port 126.

Figure 4:
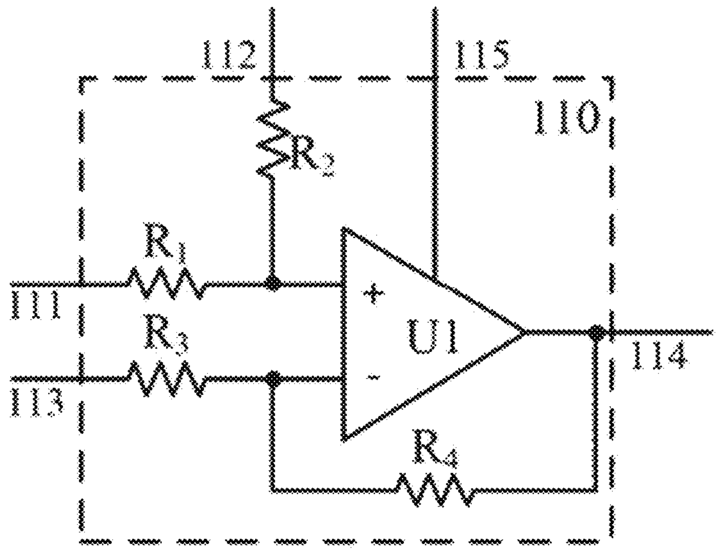
FIG. 4 is a schematic diagram of a signal amplification module according to one or more embodiments of the present application.

Specifically, as shown in FIG. 4, the signal amplification module 110 includes: an operational amplifier U1, a first resistor $R_1$, a second resistor $R_2$, a third resistor $R_3$, and a fourth resistor $R_4$.

The operational amplifier includes: a non-inverting input port, an inverting input port, an operational amplifier output port, and an operational amplifier power port.

The non-inverting input port is connected in series with the first resistor $R_1$ to serve as the signal amplification module first port 111. The non-inverting input port is connected in series with the second resistor $R_2$ to serve as the signal amplification module second port 112. The inverting input port is connected in series with the third resistor $R_3$ to serve as the signal amplification module third port 113. The operational amplifier output port serves as the signal amplification module fourth port 114. The fourth resistor $R_4$ is connected in parallel between the inverting input port and the operational amplifier output port.

Figure 5:
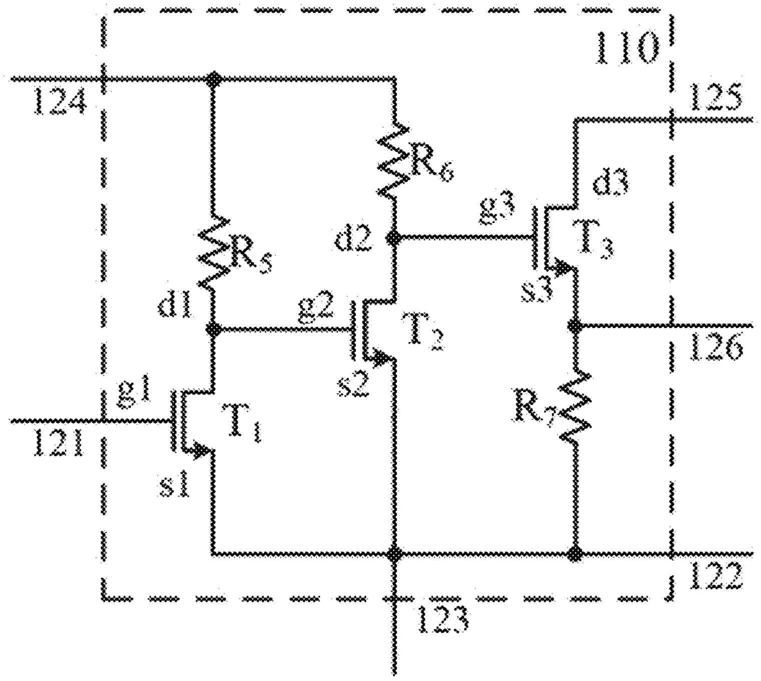
FIG. 5 is a schematic diagram of a differential level module according to one or more embodiments of the present application.

Specifically, as shown in FIG. 5, the differential level module 120 includes: a first metal oxide semiconductor (MOS) transistor $T_1$, a second MOS transistor $T_2$, a third MOS transistor $T_3$, a fifth resistor $R_5$, a sixth resistor $R_6$, and a seventh resistor $R_7$.

A gate g1 of the first MOS transistor serves as the differential level module first port 121. A drain d1 of the first MOS transistor is electrically connected to one end of the fifth resistor $R_5$. The other end of the fifth resistor $R_5$ serves as the differential level module fourth port 124.

A gate g2 of the second MOS transistor is electrically connected to the drain d1 of the first MOS transistor. A drain d2 of the second MOS transistor is electrically connected to one end of the sixth resistor $R_6$. The other end of the sixth resistor $R_6$ is electrically connected to the other end of the fifth resistor $R_5$.

A gate g3 of the third MOS transistor is electrically connected to the drain d2 of the second MOS transistor. A drain d3 of the third MOS transistor serves as the differential level module fifth port 125. A source s3 of the third MOS transistor serves as the differential level module sixth port 126. The source s3 of the third MOS transistor is electrically connected to one end of the seventh resistor. The other end of the seventh resistor $R_7$ is connected in series with a source s1 of the first MOS transistor and a source s2 of the second MOS transistor to serve as the differential level module second port 122. The source s1 of the first MOS transistor is connected in series with the source s2 of the second MOS transistor to serve as the differential level module third port 123.

An eighth resistor $R_8$ and a ninth resistor $R_9$ monitor the fuse FUSE in a voltage division manner, and control the on or off of the first MOS transistor $T_1$. In normal cases, the cathode voltage of the TVS is close to an input voltage of the voltage input end $V_{IN}$. At this moment, the first MOS transistor $T_1$ is turned on through a high level at the gate, the second MOS transistor $T_2$ is turned off, the third MOS transistor $T_3$ is turned on, and the operational amplifier power port is powered by the second power supply $V_{SS}$.

After the TVS is short circuited due to failure, the FUSE is blown due to a high current. At this moment, the first MOS transistor $T_1$ is turned off due to a low level at the gate, the second MOS transistor $T_2$ is turned on, the third MOS transistor $T_3$ is turned off, and power supplied to the operational amplifier U1 by the second power supply $V_{SS}$ is cut off.

In another one or more implementations, the differential level module 120 further includes an indicator lamp HL. The indicator lamp is configured to give a flash to alarm when the TVS is short circuited due to failure.

Figure 6:
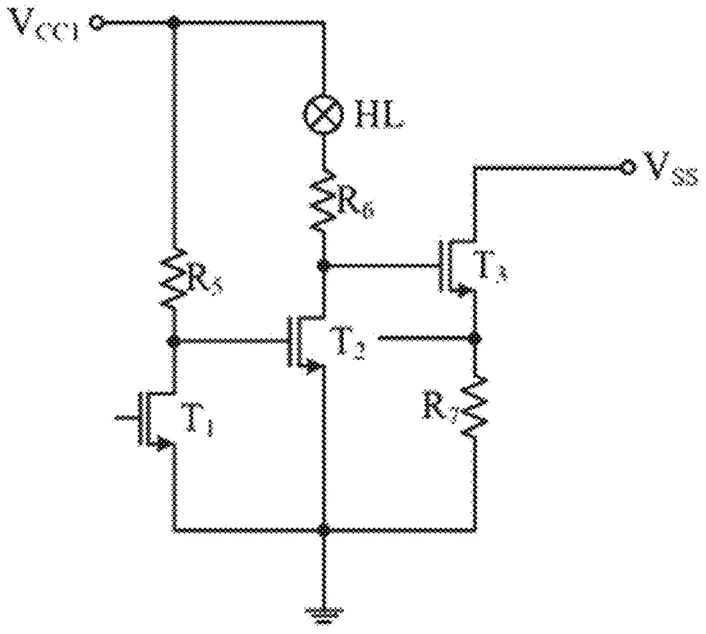
FIG. 6 is a schematic diagram of a differential level module including an indicator lamp according to one or more embodiments of the present application.

As shown in FIG. 6, when the differential level module 120 includes the indicator lamp HL, one end of the indicator lamp HL is electrically connected the other end of the sixth resistor $R_6$, and the other end of the indicator lamp HL is electrically connected the other end of the fifth resistor $R_5$ to replace a conducting wire connected between the other end of the sixth resistor $R_6$ and the other end of the fifth resistor $R_5$.

In another one or more implementations, the differential level module 120 further includes a buzzer configured to give a sound to alarm when the TVS is short circuited due to failure.

In another one or more implementations, the differential level module 120 further includes an indicator lamp and a buzzer, which simultaneously give a flash and a sound to alarm when the TVS is short circuited due to failure.

When the differential level module 120 includes different types and combinations of alarm prompt components, the differential level module 120 present different alarm effects to the outside world when the TVS is short circuited due to failure. The types and the combinations of the alarm prompt components included in the differential level module 120 and corresponding alarm effects are not limited in the present application.

Figure 7:
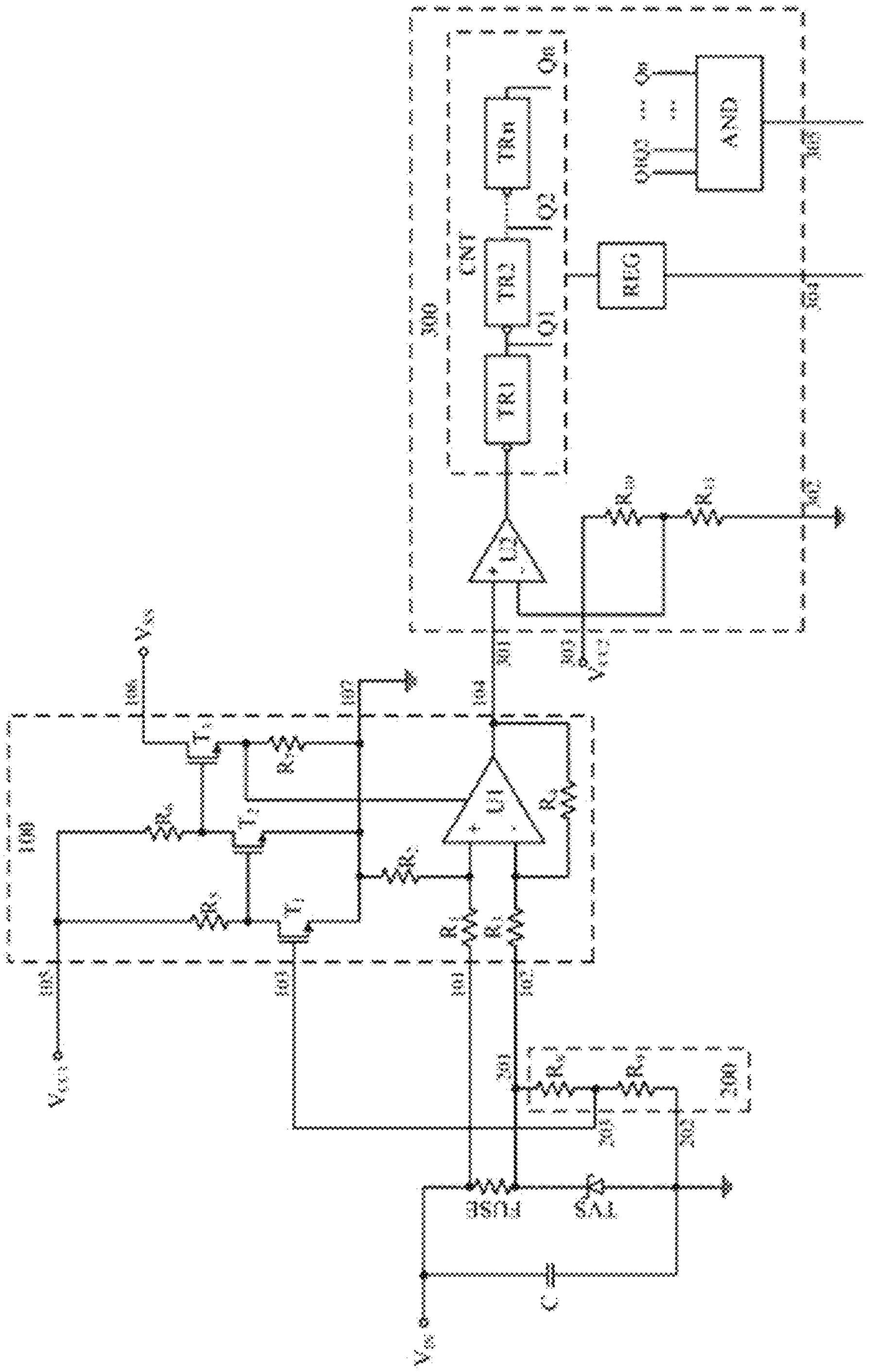
FIG. 7 is a schematic diagram of a TVS failure monitoring circuit according to one or more embodiments of the present application.

The voltage sampling module 200 in the TVS failure monitoring circuit includes: an eighth resistor $R_8$ and a ninth resistor $R_9$, as shown in FIG. 7.

One end of the eighth resistor $R_8$ serves as the voltage sampling module first port 201, the other end of the eighth resistor $R_8$ is electrically connected to one end of the ninth resistor $R_9$ to serve as the voltage sampling module third port 203, and the other end of the ninth resistor $R_9$ serves as the voltage sampling module second port 202.

The statistical module 300 in the TVS failure monitoring circuit includes: a comparator U2, a tenth resistor $R_{10}$, an eleventh resistor $R_{11}$, a counter CNT, a register REG, and an AND logic gate AND, as shown in FIG. 7.

The comparator U2 includes: a comparator non-inverting input port, a comparator inverting input port, and a comparator output port.

The counter CNT includes: a counting input port and a counting output port.

The register REG includes: a register input port and a register output port.

The AND logic gate AND includes: an AND logic input port and an AND logic output port.

The comparator non-inverting input port serves as the statistical module first port 301. The comparator inverting input port is connected in series with the eleventh resistor $R_{11}$ to serve as the statistical module second port 302. The comparator inverting input port is connected in series with the tenth resistor $R_{10}$ to serve as the statistical module third port 303. The register output port serves as the statistical module fourth port 304. The AND logic output port serves as the statistical module fifth port 305.

A reference voltage is set at the comparator inverting input port. A value of the reference voltage is determined by values of the third power supply $V_{CC2}$, the tenth resistor $R_{10}$, and the eleventh resistor $R_{11}$. An expression of the reference voltage is: $V_{ref}=V_{CC2}\cdot R_{11}/(R_{10}+R_{11})$ The comparator output port is electrically connected to the counting input port. The counting output port is electrically connected to the register input port. The counting output port is further electrically connected to the AND logic input port.

The counter CNT includes N cascaded triggers, where N is a natural number.

In the counter CNT, an output end of a preceding-stage trigger is electrically connected to an input end of a succeeding-stage trigger. An input end of a first-stage trigger is electrically connected to the comparator output port.

The counting input port is configured to receive a triggering signal. The triggering signal is generated according to the TVS active signal and a signal received by the comparator inverting input port. The counter CNT generates a counting signal at the counting output port according to the triggering signal.

When the TVS is in operation, after a voltage at two ends of the fuse FUSE is amplified through the operational amplifier U1, a voltage obtained by the comparator non-inverting input port exceeds the foregoing reference voltage $V_{ref}$, and the triggering signal at the comparator output port is converted from a low level to a high level. Every time the TVS reaches the same voltage, the triggering signal will generate a high pulse.

The triggering signal is transmitted to the counting input port of the counter CNT.

The counter CNT includes N cascaded triggers. The number N of the triggers is represented by the following formula:

$$N=[\log_2 M]$$

where, M is a nominal maximum operation count of the TVS, which can be obtained with reference to a product specification of a corresponding TVS.

In one or more implementations, the counter CNT is formed by 16 T triggers. The foregoing 16 T triggers are cascaded in sequence. A T port of a first T trigger serves as the counting input port of the counter CNT, a Q port of the first T trigger is cascaded with a T port of a second T trigger, and so on. The counter CNT accumulates once at a falling edge of the triggering signal.

The register REG generates the operation count signal according to the counting signal, and the AND logic gate AND generates the aging signal according to the counting signal.

The register REG is configured to store a value accumulated by the counter CNT. The value accumulated by the counter CNT may be obtained by the register REG in a manner of transmitting trigger state code by a bus. Alternatively, a corresponding unit of the register REG may be connected to a corresponding trigger in the counter CNT to directly obtain an accumulated value corresponding to a current state of the trigger. The accumulated value is the operation count signal, which represents an operation count of the TVS. A communication manner between the register REG and the counter CNT is not limited in the present application.

The counter CNT is electrically connected to an input end of a 16-input AND logic gate. A Q end of a corresponding trigger in the counter CNT is connected to an input end of an AND gate. When triggering signals are generated for $2^{16}$ times, a level of the 16-input AND logic gate is raised, that is, an aging signal generated by the AND logic gate AND.

Figure 8:
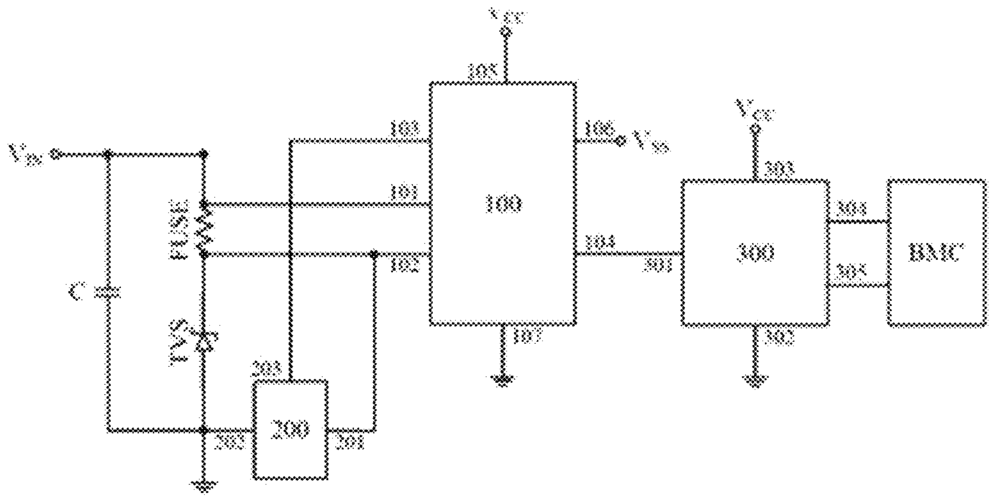
FIG. 8 is a schematic diagram of a TVS failure monitoring circuit connected to a baseboard management controller (BMC) according to one or more embodiments of the present application.

The foregoing TVS failure monitoring circuit is further electrically connected to a baseboard management controller (BMC) through the statistical module fourth port 304 and the statistical module fifth port 305, and is configured to transmit the operation count signal of the TVS and the aging signal of the TVS to the BMC, as shown in FIG. 8.

Figure 9:
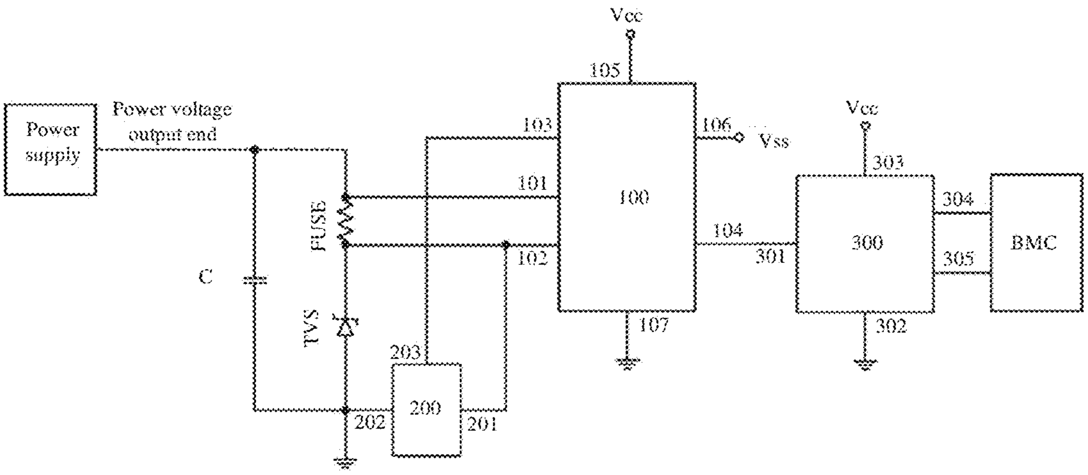
FIG. 9 is a schematic diagram of a power system according to one or more embodiments of the present application.

In another one or more embodiments, as shown in FIG. 9, a power system includes: a power supply and the TVS failure monitoring circuit recorded in the foregoing first aspect.

The power supply includes a power voltage output end. The power voltage output end is electrically connected to a voltage input end of the monitoring circuit.

The power supply is an apparatus with voltage output capability, which may be a power supply chip, a storage battery, and the like. The present application does not limit this. Preferably, the power supply is a power supply chip.

Figure 10:
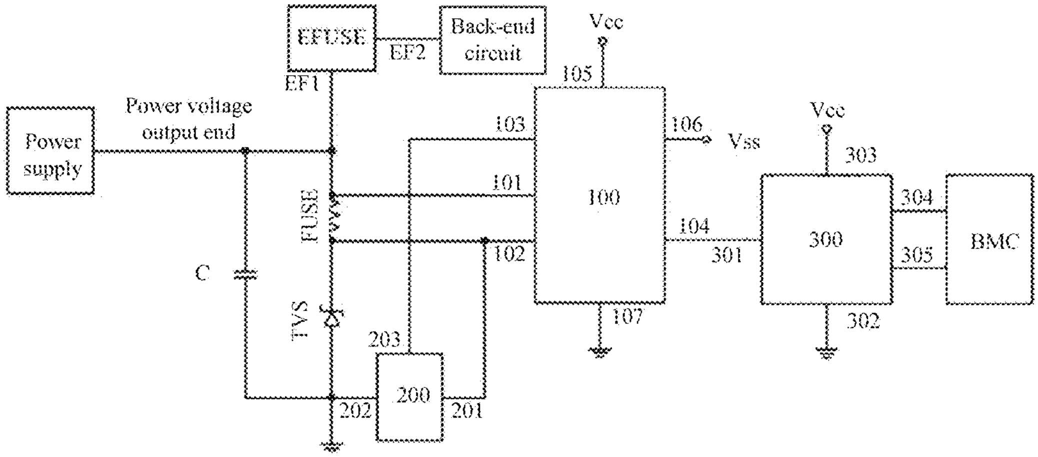
FIG. 10 is a schematic diagram of a TVS failure monitoring system according to one or more embodiments of the present application.

In another one or more embodiments, as shown in FIG. 10, a TVS failure monitoring system is provided. The monitoring system includes an electronic fuse (E-Fuse) and the power system recorded in the foregoing second aspect.

The E-Fuse EFUSE includes a first insurance port EF1 and a second insurance port EF2.

The first insurance port is electrically connected to a voltage input end of the power system. The second insurance port is configured to provide an output voltage according to a voltage received by the voltage input end.

Generally, the output voltage supplies power to a backend circuit.

Figure 11:
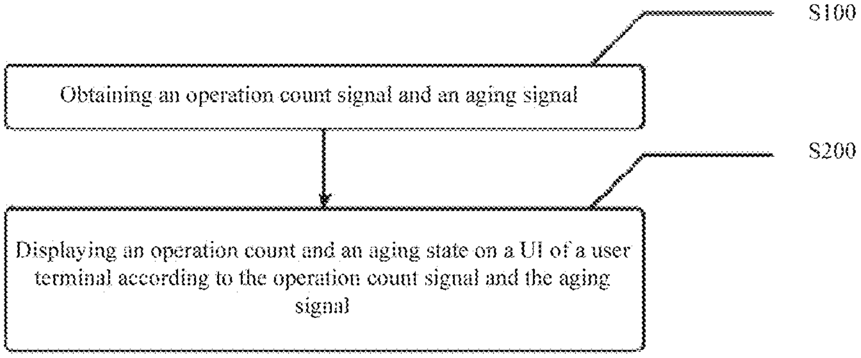
FIG. 11 is a schematic diagram of a TVS failure monitoring method according to one or more embodiments of the present application.

In another one or more embodiments, as shown in FIG. 11, a TVS failure monitoring method is provided, which is applied to the TVS failure monitoring circuit recorded in the foregoing first aspect. The method includes the following operations:

S100: Obtaining an operation count signal and an aging signal, wherein the operation count signal is used for indicating an operation count of a TVS, and the aging signal is used for indicating an aging state of the TVS.

S200: Displaying the operation count and the aging state on a user interface (UI) of a user terminal according to the operation count signal and the aging signal.

In one or more implementations, the operation of displaying the operation count and the aging state on a UI of a user terminal further includes:

issuing an alarm signal in a case that the aging state exceeds a preset aging value.

Specifically, the preset aging value is:

$$N=[\log_2 M]$$

where, N represents a number of cascaded triggers, and M represents a nominal maximum operation count of the TVS.

Figure 12:
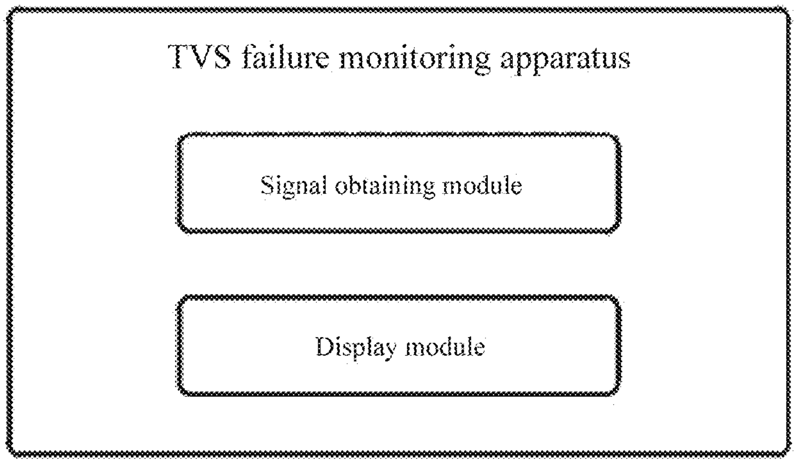
FIG. 12 is a schematic diagram of a TVS failure monitoring apparatus according to one or more embodiments of the present application.

In another one or more embodiments, as shown in FIG. 12, a TVS failure monitoring apparatus is provided. The apparatus includes: a signal obtaining module and a display module.

The signal obtaining module is configured to obtain an operation count signal and an aging signal, wherein the operation count signal is used for indicating an operation count of a TVS, and the aging signal is used for indicating an aging state of the TVS.

The display module is configured to display the operation count and the aging state on a UI of a user terminal according to the operation count signal and the aging signal.

Figure 13:
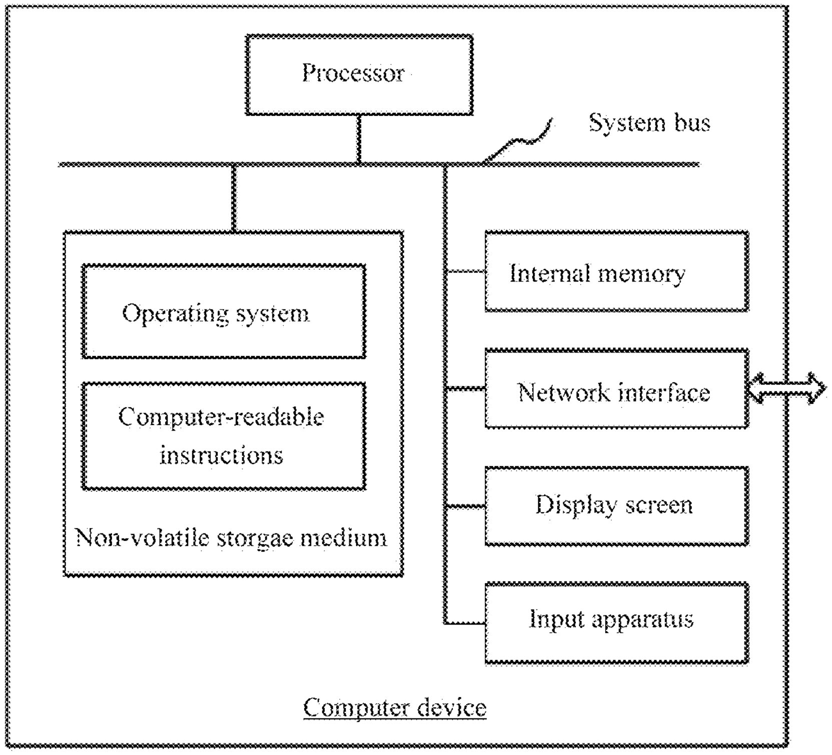
FIG. 13 is a schematic diagram of a computer device for performing a TVS failure monitoring method according to one or more embodiments of the present application.

In another one or more embodiments, as shown in FIG. 13, a computer device is provided, including a memory, a processor, and computer-readable instructions stored on the memory and executable on the processor. The processor implements the operations of the TVS failure monitoring method recorded in the foregoing fourth aspect when executing the computer-readable instructions.

In another one or more embodiments, a computer-readable storage medium is provided, having computer-readable instructions stored thereon. The computer-readable instructions implement the operations of the TVS failure monitoring method recorded in the foregoing fourth aspect when executed by a processor.

Through technical solutions provided in the embodiments of the present application, when the TVS is in operation, a number of times that the TVS releases energy can be counted, and an aging alarm can be given timely before TVS failure, which facilitates maintaining circuit components by an engineer to ensure normal operation of a server system.

An optional embodiment of the present application may be formed by using any combination of all the foregoing optional technical solutions, and details are not described one by one herein.

As shown in FIG. 2, a TVS failure monitoring circuit is provided. A cathode of a TVS is electrically connected to one end of a fuse FUSE. An anode of the TVS is grounded. The other end of the fuse FUSE is electrically connected to a voltage input end $V_{IN}$ to prevent a back-end circuit from burnout after the TVS fails and is short circuited. The TVS can change from high impedance to low impedance in a short time (generally, $10^{-12}$ seconds) when an input end encounters a voltage overshoot, so that excess energy is released to protect a post-stage circuit. The fuse FUSE has a nominal resistance value $R_{DC}$. At the instant when the TVS is turned on, a current flows through the fuse FUSE. Under the action of the current, a voltage drop is generated between two ends of the fuse FUSE.

In one or more implementations, a capacitor is further connected in parallel between the voltage input end $V_{IN}$ and the ground to further stabilize an input voltage. The TVS failure monitoring circuit includes:

- a differential amplification module 100, a voltage sampling module 200, and a statistical module 300.

The differential amplification module 100 includes: a differential amplification module first port 101, a differential amplification module second port 102, a differential amplification module third port 103, a differential amplification module fourth port 104, a differential amplification module fifth port 105, a differential amplification module sixth port 106, and a differential amplification module seventh port 107.

The voltage sampling module 200 includes: a voltage sampling module first port 201, a voltage sampling module second port 202, and a voltage sampling module third port 203.

The statistical module 300 includes: a statistical module first port 301, a statistical module second port 302, a statistical module third port 303, a statistical module fourth port 304, and a statistical module fifth module 305.

The voltage sampling module first port 201 is electrically connected to the cathode of the TVS. The voltage sampling module second port 202 is electrically connected to the anode of the TVS. The voltage sampling module third port 203 is electrically connected to the differential amplification module third port 103. The differential amplification module first port 101 is electrically connected to the voltage input end $V_{IN}$. The differential amplification module second port 102 is electrically connected to the cathode of the TVS. The differential amplification module fifth port 105 is electrically connected to a first power supply $V_{CC1}$. The differential amplification module sixth port 106 is electrically connected to a second power supply $V_{SS}$. The differential amplification module seventh port 107 is grounded. The differential amplification module fourth port 104 is electrically connected to the statistical module first port 301. The statistical module second port 302 is grounded. The statistical module third port 303 is electrically connected to a third power supply $V_{CC2}$. The statistical module fourth port 304 is configured to output an operation count signal of the TVS. The statistical module fifth port 305 is configured to output an aging signal of the TVS.

The voltage sampling module 200 generates a first signal according to a cathode voltage of the TVS, and transmits the first signal to the differential amplification module first port 101 through the voltage sampling module third port 203. The differential amplification module 100 generates the TVS active signal according to a voltage at the voltage input end $V_{IN}$, the cathode voltage of the TVS, and the first signal, and transmits the TVS active signal to the statistical module first port 301 through the differential amplification module fourth port 104. The statistical module 300 generates the operation count signal and the aging signal according to the TVS active signal.

Specifically, as shown in FIG. 3, the differential amplification module 100 includes: a signal amplification module 110 and a differential level module 120.

The signal amplification module 110 includes: a signal amplification module first port 111, a signal amplification module second port 112, a signal amplification module third port 113, a signal amplification module fourth port 114, and a signal amplification module fifth module 115.

The differential level module 120 includes: a differential level module first port 121, a differential level module second port 122, a differential level module third port 123, a differential level module fourth port 124, a differential level module fifth port 125, and a differential level module sixth port 126.

The signal amplification module second port 112 is electrically connected to the differential level module third port 123. The signal amplification module fifth port 115 is electrically connected to the differential level module sixth third port 126.

The signal amplification module first port 111 serves as the differential amplification module first port 101. The signal amplification module third port 113 serves as the differential amplification module second port 102. The differential level module first port 121 serves as the differential amplification module third port 103. The signal amplification module fourth port 114 serves as the differential amplification module fourth port 104. The differential level module fourth port 124 serves as the differential amplification module fifth port 105. The differential level module fifth port

125 serves as the differential amplification module sixth port 106. The differential level module second port 122 serves as the differential amplification module seventh port 107.

Specifically, as shown in FIG. 4, the signal amplification module 110 includes: an operational amplifier U1, a first resistor $R_1$, a second resistor $R_2$, a third resistor $R_3$, and a fourth resistor $R_4$.

The operational amplifier includes: a non-inverting input port, an inverting input port, an operational amplifier output port, and an operational amplifier power port.

The non-inverting input port is connected in series with the first resistor $R_1$ to serve as the signal amplification module first port 111. The non-inverting input port is connected in series with the second resistor $R_2$ to serve as the signal amplification module second port 112. The inverting input port is connected in series with the third resistor $R_3$ to serve as the signal amplification module third port 113. The operational amplifier output port serves as the signal amplification module fourth port 114. The fourth resistor $R_4$ is connected in parallel between the inverting input port and the operational amplifier output port.

Specifically, as shown in FIG. 5, the differential level module 120 includes: a first MOS transistor $T_1$, a second MOS transistor $T_2$, a third MOS transistor $T_3$, a fifth resistor $R_5$, a sixth resistor $R_6$, and a seventh resistor $R_7$.

A gate g1 of the first MOS transistor serves as the differential level module first port 121. A drain d1 of the first MOS transistor is electrically connected to one end of the fifth resistor $R_5$. The other end of the fifth resistor $R_5$ serves as the differential level module fourth port 124.

A gate g2 of the second MOS transistor is electrically connected to the drain d1 of the first MOS transistor. A drain of the second MOS transistor is electrically connected to one end of the sixth resistor $R_6$. The other end of the sixth resistor $R_6$ is electrically connected to the other end of the fifth resistor $R_5$.

A gate g3 of the third MOS transistor is electrically connected to the drain d2 of the second MOS transistor. A drain d3 of the third MOS transistor serves as the differential level module fifth port 125. A source s3 of the third MOS transistor serves as the differential level module sixth port 126. The source s3 of the third MOS transistor is electrically connected to one end of the seventh resistor $R_7$. The other end of the seventh resistor $R_7$ is connected in series with a source s1 of the first MOS transistor and a source s2 of the second MOS transistor to serve as the differential level module second port 122. The source s1 of the first MOS transistor is connected in series with the source s2 of the second MOS transistor to serve as the differential level module third port 123.

An eighth resistor $R_8$ and a ninth resistor $R_9$ monitor the fuse FUSE in a voltage division manner, and control the on or off of the first MOS transistor $T_1$. In normal cases, the cathode voltage of the TVS is close to an input voltage of the voltage input end $V_{IN}$. At this moment, the first MOS transistor $T_1$ is turned on through a high level at the gate, the second MOS transistor $T_2$ is turned off, the third MOS transistor $T_3$ is turned on, and the operational amplifier power port is powered by the second power supply $V_{SS}$.

After the TVS is short circuited due to failure, the FUSE is blown due to a high current. At this moment, the first MOS transistor $T_1$ is turned off due to a low level at the gate, the second MOS transistor $T_2$ is turned on, the third MOS transistor $T_3$ is turned off, and power supplied to the operational amplifier U1 by the second power supply $V_{SS}$ is cut off.

In another one or more implementations, the differential level module 120 further includes an indicator lamp HL. The indicator lamp is configured to give a flash to alarm when the TVS is short circuited due to failure.

As shown in FIG. 6, when the differential level module 120 includes the indicator lamp HL, one end of the indicator lamp HL is electrically connected the other end of the sixth resistor $R_6$, and the other end of the indicator lamp HL is electrically connected the other end of the fifth resistor $R_5$ to replace a conducting wire connected between the other end of the sixth resistor $R_6$ and the other end of the fifth resistor $R_5$.

In another one or more implementations, the differential level module 120 further includes a buzzer configured to give a sound to alarm when the TVS is short circuited due to failure.

In another one or more implementations, the differential level module 120 further includes an indicator lamp and a buzzer, which simultaneously give a flash and a sound to alarm when the TVS is short circuited due to failure.

When the differential level module 120 includes different types and combinations of alarm prompt components, the differential level module 120 present different alarm effects to the outside world when the TVS is short circuited due to failure. The types and the combinations of the alarm prompt components included in the differential level module 120 and corresponding alarm effects are not limited in the present application.

The voltage sampling module 200 in the TVS failure monitoring circuit includes: an eighth resistor $R_8$ and a ninth resistor $R_9$, as shown in FIG. 7.

One end of the eighth resistor $R_8$ serves as the voltage sampling module first port 201, the other end of the eighth resistor $R_8$ is electrically connected to one end of the ninth resistor $R_9$ to serve as the voltage sampling module third port 203, and the other end of the ninth resistor $R_9$ serves as the voltage sampling module second port 202.

The statistical module 300 in the TVS failure monitoring circuit includes: a comparator U2, a tenth resistor $R_{10}$, an eleventh resistor $R_{11}$, a counter CNT, a register REG, and an AND logic gate AND, as shown in FIG. 7.

The comparator U2 includes: a comparator non-inverting input port, a comparator inverting input port, and a comparator output port.

The counter CNT includes: a counting input port and a counting output port.

The register REG includes: a register input port and a register output port.

The AND logic gate AND includes: an AND logic input port and an AND logic output port.

The comparator non-inverting input port serves as the statistical module first port 301. The comparator inverting input port is connected in series with the eleventh resistor $R_{11}$ to serve as the statistical module second port 302. The comparator inverting input port is connected in series with the tenth resistor $R_{10}$ to serve as the statistical module third port 303. The register output port serves as the statistical module fourth port 304. The AND logic output port serves as the statistical module fifth port 305.

A reference voltage is set at the comparator inverting input port. A value of the reference voltage is determined by values of the third power supply $V_{CC2}$, the tenth resistor $R_{10}$, and the eleventh resistor $R_{11}$. An expression of the reference voltage is: $V_{ref}=V_{CC2}\cdot R_{11}/(R_{10}+R_{11})$ The comparator output port is electrically connected to the counting input port. The counting output port is electrically connected to the register input port. The counting output port is further electrically connected to the AND logic input port.

The counter CNT includes N cascaded triggers, where Nis a natural number.

In the counter CNT, an output end of a preceding-stage trigger is electrically connected to an input end of a succeeding-stage trigger. An input end of a first-stage trigger is electrically connected to the comparator output port.

The counting input port is configured to receive a triggering signal. The triggering signal is generated according to the TVS active signal and a signal received by the comparator inverting input port. The counter CNT generates a counting signal at the counting output port according to the triggering signal.

When the TVS is in operation, after a voltage at two ends of the fuse FUSE is amplified through the operational amplifier U1, a voltage obtained by the comparator non-inverting input port exceeds the foregoing reference voltage $V_{ref}$, and the triggering signal at the comparator output port is converted from a low level to a high level. Every time the TVS reaches the same voltage, the triggering signal will generate a high pulse.

The triggering signal is transmitted to the counting input port of the counter CNT.

The counter CNT includes N cascaded triggers. The number N of the triggers is represented by the following formula:

$$N=[\log_2 M]$$

where, M is a nominal maximum operation count of the TVS, which can be obtained with reference to a product specification of a corresponding TVS.

In one or more implementations, the counter CNT is formed by 16 T triggers. The foregoing 16 T triggers are cascaded in sequence. A T port of a first T trigger serves as the counting input port of the counter CNT, a Q port of the first T trigger is cascaded with a T port of a second T trigger, and so on. The counter CNT accumulates once at a falling edge of the triggering signal.

The register REG generates the operation count signal according to the counting signal, and the AND logic gate AND generates the aging signal according to the counting signal.

The register REG is configured to store a value accumulated by the counter CNT. The value accumulated by the counter CNT may be obtained by the register REG in a manner of transmitting trigger state code by a bus. Alternatively, a corresponding unit of the register REG may be connected to a corresponding trigger in the counter CNT to directly obtain an accumulated value corresponding to a current state of the trigger. The accumulated value is the operation count signal, which represents an operation count of the TVS. A communication manner between the register REG and the counter CNT is not limited in the present application.

The counter CNT is electrically connected to an input end of a 16-input AND logic gate. A Q end of a corresponding trigger in the counter CNT is connected to an input end of an AND gate. When triggering signals are generated for $2^{16}$ times, a level of the 16-input AND logic gate is raised, that is, an aging signal generated by the AND logic gate AND.

The foregoing TVS failure monitoring circuit is further electrically connected to a BMC through the statistical module fourth port 304 and the statistical module fifth port 305, and is configured to transmit the operation count signal of the TVS and the aging signal of the TVS to the BMC, as shown in FIG. 8.

Through technical solutions provided in the embodiments of the present application, when a TVS is in operation, a number of times that the TVS releases energy can be counted, and an aging alarm can be given timely before TVS failure, which facilitates maintaining circuit components by an engineer to ensure normal operation of a server system.

A minimum value $R_{DC}$ (min)=10 milliohms of the fuse FUSE is selected as $R_{DC}$. A peak pulse current (IPP) of the TVS is 10 A.

The reference voltage $V_{ref}$ of the comparator U2 is equal to 1 V.

The first resistor $R_1$ is 1 kiloohms, and the second resistor $R_2$ is 100 kiloohms.

In normal cases, the first MOS transistor $T_1$ is turned on, the second MOS transistor $T_2$ is turned off, the third MOS transistor $T_3$ is turned on, and the operational amplifier U1 is powered by the second power supply $V_{SS}$. There is no current flowing through the fuse FUSE, the TVS active signal does not generate a pulse, and the count of the counter CNT does not increase.

When the TVS is in operation and the fuse FUSE is complete, the current exceeds 1A instantly, the TVS active signal generates a high pulse, and the count of the counter CNT increases due to a falling edge of the high pulse.

When the TVS does not fail, but the TVS is turned on for certain times, the TVS has a risk of failure. The risk of failure of the TVS can be evaluated timely by reading the operation count signal and the aging signal through the BMC.

When the TVS is short circuited due to failure, the fuse FUSE is blown. At this moment, the first MOS transistor $T_1$ is turned off, the second MOS transistor $T_2$ is turned on, a lamp bead is lighted, or a buzzer is triggered to give an alarm. The third MOS transistor $T_3$ is turned off. The second power supply $V_{SS}$ stops supplying power to the operational amplifier U1.

As shown in FIG. 9, a power system includes: a power supply and the TVS failure monitoring circuit recorded in the foregoing first aspect.

The power supply includes a power voltage output end. The power voltage output end is electrically connected to a voltage input end of the monitoring circuit.

The power supply is an apparatus with voltage output capability, which may be a power supply chip, a storage battery, and the like. The present application does not limit this. Preferably, the power supply is a power supply chip.

As shown in FIG. 10, a TVS failure monitoring system is provided. The monitoring system includes an E-Fuse and the power system recorded in the foregoing second aspect.

The E-Fuse EFUSE includes a first insurance port and a second insurance port.

The first insurance port is electrically connected to a voltage input end of the power system. The second insurance port is configured to provide an output voltage according to a voltage received by the voltage input end.

Generally, the output voltage supplies power to a back-end circuit.

As shown in FIG. 11, a TVS failure monitoring method is provided, which is applied to the TVS failure monitoring circuit recorded in the foregoing first aspect. The method includes the following operations:

S100: Obtaining an operation count signal and an aging signal, wherein the operation count signal is used for indicating an operation count of a TVS, and the aging signal is used for indicating an aging state of the TVS.

S200: Displaying the operation count and the aging state on a UI of a user terminal according to the operation count signal and the aging signal.

In one or more implementations, the operation of displaying the operation count and the aging state on a UI of a user terminal further includes:

issuing an alarm signal in a case that the aging state exceeds a preset aging value.

Specifically, the preset aging value is:

$$N=[\log_2 M]$$

where, N represents a number of cascaded triggers, and M represents a nominal maximum operation count of the TVS.

As shown in FIG. 12, a TVS failure monitoring apparatus is provided. The apparatus includes: a signal obtaining module and a display module.

The signal obtaining module is configured to obtain an operation count signal and an aging signal, wherein the operation count signal is used for indicating an operation count of a TVS, and the aging signal is used for indicating an aging state of the TVS.

The display module is configured to display the operation count and the aging state on a UI of a user terminal according to the operation count signal and the aging signal.

As shown in FIG. 13, a memory and one or more processors are included. The memory stores computer-readable instructions. The computer-readable instructions enable, when executed by the one or more processors, the one or more processors to perform the operations of the TVS failure monitoring method recorded in the foregoing fourth aspect. The operations specifically include:

S100: Obtaining an operation count signal and an aging signal, wherein the operation count signal is used for indicating an operation count of a TVS, and the aging signal is used for indicating an aging state of the TVS.

S200: Displaying the operation count and the aging state on a UI of a user terminal according to the operation count signal and the aging signal.

A non-volatile computer-readable storage medium is provided. The non-volatile computer-readable storage medium stores computer-readable instructions. The computer-readable instructions may implement, when executed by one or more processors, the operations of the TVS failure monitoring method recorded in the foregoing fourth aspect. The operations specifically include:

S100: Obtaining an operation count signal and an aging signal, wherein the operation count signal is used for indicating an operation count of a TVS, and the aging signal is used for indicating an aging state of the TVS.

S200: Displaying the operation count and the aging state on a UI of a user terminal according to the operation count signal and the aging signal.

Particularly, according to an embodiment of the present application, the process described with reference to a flowchart above may be implemented as a computer software program. For example, an embodiment of the present application includes a computer-readable instruction product, including computer-readable instructions loaded on a computer-readable medium. The computer-readable instructions include program code for performing the method shown in the flowchart. In such an embodiment, the computer-readable instructions may be downloaded and installed from a network through a communication apparatus, and/or installed from a memory, or installed from a read only memory (ROM). The foregoing functions limited in the method of the embodiments of the present application are implemented when the computer-readable instructions are executed by an external processor.

It is to be noted that the computer-readable medium of the embodiments of the present application may be a computer-readable signal medium or a computer-readable storage medium or any combination thereof. The computer-readable storage medium may be, for example, but not limited to, an electronic, magnetic, optical, electromagnetic, infrared, or semiconductor system, apparatus, or device, or any combination thereof. A more specific example of the computer-readable storage medium may include, but is not limited to: an electric connection with one or more conducting wires, a portable computer disk, a hard disk, a random access memory (RAM), a ROM, an erasable programmable ROM (EPROM or a flash memory), an optical fiber, a portable compact disk-ROM (CD-ROM), an optical storage device, a magnetic storage device, or any suitable combination thereof. In an embodiment of the present application, the computer-readable storage medium may be any tangible medium that contains or stores a program. The program may be used by or combined with an instruction execution system, apparatus, or device. In an embodiment of the present application, the computer-readable signal medium may include a data signal that is propagated in a baseband or as a part of a carrier and that carries computer-readable program code. Such propagated data signals may take a variety of forms including, but not limited to, electromagnetic signals, optical signals, or any suitable combination thereof. The computer-readable signal medium may alternatively be any computer-readable medium other than a computer-readable storage medium, and the computer-readable signal medium may send, propagate, or transmit a program used by or combined with an instruction execution system, apparatus, or device. Program code contained in the computer-readable medium may be transmitted by any suitable medium, including, but not limited to, a wire, an optical fiber, radio frequency (RF) and the like, or any suitable combination of thereof.

The foregoing computer-readable medium may be included in the foregoing server, may exist separately without being assembled into the server. The foregoing computer-readable medium carries one or more programs. The foregoing one or more programs enable, when executed by the server, the server to: obtain a frame rate applied to a terminal in response to detecting that an external mode of the terminal is not activated; determine whether a user is obtaining screen information of the terminal in a case that the frame rate satisfies a screen off condition; and control a screen to enter an immediate dimming mode in response to that a determination result indicates that the user does not obtain the screen information of the terminal.

Computer-readable instruction code for performing operations of the embodiments of the present application may be written in one or more programming languages, or combinations thereof. The programming languages include object-oriented programming languages such as Java, Smalltalk, and C++, and further include conventional procedural programming languages such as "C" or similar programming languages. The program code may be executed entirely on a user computer, partially on a user computer, as an independent software package, partially on a user computer and partially on a remote computer, or entirely on a remote computer or server. In the case of involving the remote computer, the remote computer may be connected to the user computer through any types of networks, including a local area network (LAN) or wide area network (WAN), or may be connected to an external computer (such as connected through the Internet using an Internet service provider).

Various embodiments in this specification are all described in a progressive manner. For the same or similar parts among various embodiments may refer to each other. Each embodiment focuses on the differences from other embodiments. Particularly, a system or a system embodiment are relatively simply described because the system or the system embodiment is basically similar to a method embodiment. For relevant parts, refer to the description of the method embodiment. The system and the system embodiment described above are merely illustrative. The units described as separate components may be or may not be physically separated, and the parts displayed as units may be or may not be physical units, which may be located in one place or distributed to multiple network units. Part or all of the modules may be selected according to actual needs to achieve the objective of the solution of the present embodiment. Those of ordinary skill in the art may understand and implement the present application without creative work.

Technical solutions provided in the present application are described above in detail. Principles and implementations of the present application are described with specific examples herein. The description of the above embodiments is only for helping to understand the method of the present application and its core ideas. Furthermore, for those of ordinary skill in the art, according to the idea of the present application, there will be changes in specific implementations and application scopes. In conclusion, content of the present specification is not to be construed as a limitation to the present application.

The above descriptions are merely preferred embodiments of the present application, but are used not to limit the present application. Any modification, equivalent replacement, improvement or the like made within the spirit and principle of the present application are included in the scope of protection of the present application.

What is claimed is:

1. A transient voltage suppressor (TVS) failure monitoring circuit, wherein a cathode of a TVS is electrically connected to one end of a fuse, an anode of the TVS is grounded, the other end of the fuse is electrically connected to a voltage input end, and the circuit comprises:

a differential amplification module, a voltage sampling module, and a statistical module;

the differential amplification module comprises: a differential amplification module first port, a differential amplification module second port, a differential amplification module third port, a differential amplification module fourth port, a differential amplification module fifth port, a differential amplification module sixth port, and a differential amplification module seventh port, wherein the differential amplification module first port is configured to obtain an input voltage, the differential amplification module second port is configured to obtain a cathode voltage drop of the TVS, the differential amplification module third port is configured to obtain a sampling voltage of the voltage sampling module, the differential amplification module fourth port is configured to transmit a TVS active signal, the differential amplification module fifth port and the differential amplification module sixth port are configured to obtain a power voltage, and the differential amplification module seventh port is grounded, wherein the TVS active signal is used for indicating that the TVS is switched from a high impedance state to a low impedance state and then returns to the high impedance state; the voltage sampling module comprises: a voltage sampling module first port, a voltage sampling module second port, and a voltage sampling module third port, wherein the voltage sampling module first port is configured to obtain the cathode voltage drop of the TVS, and the voltage sampling module third port is configured to sample the cathode voltage drop of the TVS;

the statistical module comprises: a statistical module first port, a statistical module second port, a statistical module third port, a statistical module fourth port, and a statistical module fifth port, wherein the statistical module first port is configured to obtain the TVS active signal, the statistical module second port is grounded, the statistical module third port is configured to obtain the power voltage, the statistical module fourth port is configured to output an operation count signal of the TVS, and the statistical module fifth port is configured to output an aging signal of the TVS; and the voltage sampling module first port is electrically connected to the cathode of the TVS, the voltage sampling module second port is electrically connected to the anode of the TVS, the voltage sampling module third port is electrically connected to the differential amplification module third port, the differential amplification module first port is electrically connected to the voltage input end, the differential amplification module second port is electrically connected to the cathode of the TVS, the differential amplification module fifth port is electrically connected to a first power supply, the differential amplification module sixth port is electrically connected to a second power supply, the differential amplification module fourth port is electrically connected to the statistical module first port, and the statistical module third port is electrically connected to a third power supply.

2. The TVS failure monitoring circuit according to claim 1, wherein the voltage sampling module generates a first signal according to a cathode voltage of the TVS, and transmits the first signal to the differential amplification module first port through the voltage sampling module third port;

the differential amplification module generates the TVS active signal according to a voltage at the voltage input end, the cathode voltage of the TVS, and the first signal, and transmits the TVS active signal to the statistical module first port through the differential amplification module fourth port; and the statistical module generates the operation count signal and the aging signal according to the TVS active signal.

3. The TVS failure monitoring circuit according to claim 1, wherein the differential amplification module comprises: a signal amplification module and a differential level module;

the signal amplification module comprises a signal amplification module first port, a signal amplification module second port, a signal amplification module third port, a signal amplification module fourth port, and a signal amplification module fifth port, wherein the signal amplification module first port serves as the differential amplification module first port and is configured to obtain the input voltage, the signal amplification module second port is grounded, the signal amplification module third port serves as the differential amplification module second port and is configured to obtain the cathode voltage drop of the TVS, the signal amplification module fourth port serves as the differential amplification module fourth port and is configured to transmit the TVS active signal, and the signal amplification module fifth port is configured to obtain the power voltage;

the differential level module comprises: a differential level module first port, a differential level module second port, a differential level module third port, a differential level module fourth port, a differential level module fifth port, and a differential level module sixth port, wherein the differential level module first port serves as the differential amplification module third port and is configured to obtain the sampling voltage of the voltage sampling module, the differential level module second port serves as the differential amplification module seventh port and is grounded, the differential level module third port is grounded, the differential level module fourth port serves as the differential amplification module fifth port, the differential level module fifth port serves as the differential amplification module sixth port and is configured to obtain the power voltage, and the differential level module sixth port is configured to supply the power voltage to the signal amplification module; and the signal amplification module second port is electrically connected to the differential level module third port, and the signal amplification module fifth port is electrically connected to the differential level module sixth port.

4. The TVS failure monitoring circuit according to claim 3, wherein the signal amplification module comprises: an operational amplifier, a first resistor, a second resistor, a third resistor, and a fourth resistor;

the operational amplifier comprises: a non-inverting input port, an inverting input port, an operational amplifier output port, and an operational amplifier power port; and the non-inverting input port is connected in series with the first resistor to serve as the signal amplification module first port, the non-inverting input port is connected in series with the second resistor to serve as the signal amplification module second port, the inverting input port is connected in series with the third resistor to serve as the signal amplification module third port, the operational amplifier output port serves as the signal amplification module fourth port, and the fourth resistor is connected in parallel between the inverting input port and the operational amplifier output port.

5. The TVS failure monitoring circuit according to claim 3, wherein the differential level module comprises: a first metal oxide semiconductor (MOS) transistor, a second MOS transistor, a third MOS transistor, a fifth resistor, a sixth resistor, and a seventh resistor; and a gate of the first MOS transistor serves as the differential level module first port, a drain of the first MOS transistor is electrically connected to one end of the fifth resistor, a second end of the fifth resistor serves as the differential level module fourth port, a gate of the second MOS transistor is electrically connected to the drain of the first MOS transistor, a drain of the second MOS transistor is electrically connected to one end of the sixth resistor, a second end of the sixth resistor is electrically connected to the second end of the fifth resistor, a gate of the third MOS transistor is electrically connected to the drain of the second MOS transistor, a drain of the third MOS transistor serves as the differential level module fifth port, a source of the third MOS transistor serves as the differential level module sixth port, the source of the third MOS transistor is electrically connected to one end of the seventh resistor, a second end of the seventh resistor is connected in series with a source of the first MOS transistor and a source of the second MOS transistor to serve as the differential level module second port, and the source of the first MOS transistor is connected in series with the source of the second MOS transistor to serve as the differential level module third port.

6. The TVS failure monitoring circuit according to claim 1, wherein the voltage sampling module comprises: an eighth resistor and a ninth resistor; and one end of the eighth resistor serves as the voltage sampling module first port, a second end of the eighth resistor is electrically connected to one end of the ninth resistor to serve as the voltage sampling module third port, and a second end of the ninth resistor serves as the voltage sampling module second port.

7. The TVS failure monitoring circuit according to claim 1, wherein the statistical module comprises: a comparator, a tenth resistor, an eleventh resistor, a counter, a register, and an AND logic gate;

the comparator comprises: a comparator non-inverting input port, a comparator inverting input port, and a comparator output port;

the counter comprises: a counting input port and a counting output port;

the register comprises: a register input port and a register output port;

the AND logic gate comprises: an AND logic input port and an AND logic output port;

the comparator non-inverting input port serves as the statistical module first port, the comparator inverting input port is connected in series with the eleventh resistor to serve as the statistical module second port, the comparator inverting input port is connected in series with the tenth resistor to serve as the statistical module third port, the register output port serves as the statistical module fourth port, and the AND logic output port serves as the statistical module fifth port; and the comparator output port is electrically connected to the counting input port, the counting output port is electrically connected to the register input port, and the counting output port is further electrically connected to the AND logic input port.

8. The TVS failure monitoring circuit according to claim 7, wherein the counter comprises: N cascaded triggers, wherein N is a natural number; and in the counter, an output end of a preceding-stage trigger of the N cascaded triggers is electrically connected to an input end of a succeeding-stage trigger of the N cascaded triggers, wherein an input end of a first-stage trigger of the N cascaded triggers is electrically connected to the comparator output port.

9. The TVS failure monitoring circuit according to claim 8, wherein the counting input port is configured to receive a triggering signal, and the triggering signal is generated according to the TVS active signal and a signal received by the comparator inverting input port; and the counter generates a counting signal at the counting output port according to the triggering signal.

10. The TVS failure monitoring circuit according to claim 9, wherein the register generates the operation count signal according to the counting signal, and the AND logic gate generates the aging signal according to the counting signal.

11. The TVS failure monitoring circuit according to claim 1, wherein the TVS failure monitoring circuit is further electrically connected to a baseboard management controller (BMC) through the statistical module fourth port and the statistical module fifth port, and is configured to transmit the operation count signal of the TVS and the aging signal of the TVS to the BMC.

12. A power system, comprising: a power supply and the TVS failure monitoring circuit according to claim 1, wherein the power supply comprises a power voltage output end, and the power voltage output end is electrically connected to the voltage input end of the TVS failure monitoring circuit.

13. A TVS failure monitoring system, comprising: an electronic fuse (E-Fuse) and the power system according to claim 12, wherein the E-Fuse comprises a first insurance port and a second insurance port; and the first insurance port is electrically connected to a voltage input end of the power system, and the second insurance port is configured to provide an output voltage according to a voltage received by the voltage input end of the power system.

14. A TVS failure monitoring method, applied to the TVS failure monitoring circuit according to claim 1, wherein the method comprises:

obtaining the operation count signal and the aging signal, wherein the operation count signal is used for indicating an operation count of the TVS, and the aging signal is used for indicating an aging state of the TVS; and displaying the operation count and the aging state on a user interface (UI) of a user terminal according to the operation count signal and the aging signal.

15. One or more non-transitory non-volatile computer-readable storage media storing computer-readable instructions, wherein the computer-readable instructions enable, when executed by one or more processors, the one or more processors to perform the operations of the method according to claim 14.

16. A computer device, comprising a memory and one or more processors, the memory storing computer-readable instructions, wherein the computer-readable instructions enable, when executed by the one or more processors, the one or more processors to perform operations of:

obtaining an operation count signal and an aging signal, wherein the operation count signal is used for indicating an operation count of a transient voltage suppressor (TVS), and the aging signal is used for indicating an aging state of the TVS; and displaying the operation count and the aging state on a user interface (UI) of a user terminal according to the operation count signal and the aging signal;

wherein the operations are applied by a transient voltage suppressor (TVS) failure monitoring circuit, wherein a cathode of a TVS is electrically connected to one end of a fuse, an anode of the TVS is grounded, the other end of the fuse is electrically connected to a voltage input end, and the circuit comprises:

a differential amplification module, a voltage sampling module, and a statistical module;

the differential amplification module comprises: a differential amplification module first port, a differential amplification module second port, a differential amplification module third port, a differential amplification module fourth port, a differential amplification module fifth port, a differential amplification module sixth port, and a differential amplification module seventh port, wherein the differential amplification module first port is configured to obtain an input voltage, the differential amplification module second port is configured to obtain a cathode voltage drop of the TVS, the differential amplification module third port is configured to obtain a sampling voltage of the voltage sampling module, the differential amplification module fourth port is configured to transmit a TVS active signal, the differential amplification module fifth port and the differential amplification module sixth port are configured to obtain a power voltage, and the differential amplification module seventh port is grounded, wherein the TVS active signal is used for indicating that the TVS is switched from a high impedance state to a low impedance state and then returns to the high impedance state; the voltage sampling module comprises: a voltage sampling module first port, a voltage sampling module second port, and a voltage sampling module third port, wherein the voltage sampling module first port is configured to obtain the cathode voltage drop of the TVS, and the voltage sampling module third port is configured to sample the cathode voltage drop of the TVS;

the statistical module comprises: a statistical module first port, a statistical module second port, a statistical module third port, a statistical module fourth port, and a statistical module fifth port, wherein the statistical module first port is configured to obtain the TVS active signal, the statistical module second port is grounded, the statistical module third port is configured to obtain the power voltage, the statistical module fourth port is configured to output an operation count signal of the TVS, and the statistical module fifth port is configured to output an aging signal of the TVS; and the voltage sampling module first port is electrically connected to the cathode of the TVS, the voltage sampling module second port is electrically connected to the anode of the TVS, the voltage sampling module third port is electrically connected to the differential amplification module third port, the differential amplification module first port is electrically connected to the voltage input end, the differential amplification module second port is electrically connected to the cathode of the TVS, the differential amplification module fifth port is electrically connected to a first power supply, the differential amplification module sixth port is electrically connected to a second power supply, the differential amplification module fourth port is electrically connected to the statistical module first port, and the statistical module third port is electrically connected to a third power supply.

17. A transient voltage suppressor (TVS) failure monitoring circuit, wherein a cathode of a TVS is electrically connected to one end of a fuse, an anode of the TVS is grounded, the other end of the fuse is electrically connected to a voltage input end, and the circuit comprises:

a differential amplification module, a voltage sampling module, and a statistical module;

a differential amplification module first port of the differential amplification module is electrically connected to the voltage input end, a differential amplification module second port of the differential amplification module is electrically connected to the cathode of the TVS, a differential amplification module third port of the differential amplification module is configured to obtain a sampling voltage of the voltage sampling module, a differential amplification module fourth port of the differential amplification module is electrically connected to a statistical module first port of the statistical module and is configured to transmit a TVS active signal, wherein the differential amplification module generates the TVS active signal according to a voltage at the voltage input end, a cathode voltage of the TVS and a first signal, wherein the first signal is generated according to a sampling voltage of the voltage sampling module, wherein the TVS active signal is used for indicating that the TVS is switched from a high impedance state to a low impedance state and then returns to the high impedance state;

a voltage sampling module first port is of the voltage sampling module electrically connected to a cathode of the TVS, a voltage sampling module second port of the voltage sampling module is electrically connected to a anode of the TVS, a voltage sampling module third port of the voltage sampling module is electrically connected to the differential amplification module third port;

a statistical module first port is statistical module of the statistical module is configured to obtain the TVS active signal, a statistical module fourth port of the statistical module is configured to output an operation count signal of the TVS, and a statistical module fifth port of the statistical module is configured to output an aging signal of the TVS.

18. The TVS failure monitoring circuit according to claim 17, wherein a differential amplification module fourth port of the differential amplification module is electrically connected to the statistical module first port, the differential amplification module fourth port is configured to transmit a TVS active signal;

a differential amplification module fifth port of the differential amplification module is electrically connected to a first power supply, a differential amplification module sixth port of the differential amplification module is electrically connected to a second power supply, a differential amplification module seventh port of the differential amplification module is grounded.

19. The TVS failure monitoring circuit according to claim 17, wherein the voltage sampling module first port is configured to obtain the cathode voltage drop of the TVS, and the voltage sampling module third port is configured to sample the cathode voltage drop of the TVS.

20. The TVS failure monitoring circuit according to claim 17, wherein a statistical module second port of the statistical module is grounded, and a statistical module third port of the statistical module is configured to obtain the power voltage.

* * * * *